(12) United States Patent
Ng et al.

(10) Patent No.: US 7,002,493 B2
(45) Date of Patent: Feb. 21, 2006

(54) BOOLEAN LOGIC TREE REDUCTION CIRCUIT

(75) Inventors: Fuk Ho Pius Ng, Plano, TX (US); Liem Thanh Nguyen, Plano, TX (US)

(73) Assignee: Mathstar, Inc., Mpls., MN (US)

( * ) Notice: Subject to any disclaimer, the term of this patent is extended or adjusted under 35 U.S.C. 154(b) by 153 days.

(21) Appl. No.: 10/754,665

(22) Filed: Jan. 8, 2004

(65) Prior Publication Data

US 2005/0154771 A1 Jul. 14, 2005

(51) Int. Cl.
*H03M 7/00* (2006.01)

(52) U.S. Cl. .......................................... 341/79; 341/51

(58) Field of Classification Search ................... 341/79
See application file for complete search history.

(56) References Cited

U.S. PATENT DOCUMENTS

| | | | | |
|---|---|---|---|---|
| 5,418,947 A | * | 5/1995 | Hsu et al. ........................ | 707/1 |
| 5,493,524 A | * | 2/1996 | Guttag et al. ................ | 708/709 |
| 5,859,601 A | * | 1/1999 | Moon et al. .................... | 341/59 |
| 5,990,810 A | * | 11/1999 | Williams ........................ | 341/51 |
| 6,104,325 A | * | 8/2000 | Liaw et al. ..................... | 341/63 |
| 6,154,156 A | * | 11/2000 | Tagato .......................... | 341/79 |
| 6,667,700 B1 | * | 12/2003 | McCanne et al. .............. | 341/51 |

* cited by examiner

*Primary Examiner*—Linh Van Nguyen
(74) *Attorney, Agent, or Firm*—Westman, Champlin & Kelly

(57) ABSTRACT

A method and apparatus are provided for performing a Boolean logic tree function on all bits of a multiple-bit binary input data word having a plurality of bit positions. Each bit has one of first and second complementary logic states. A modified data word is formed by packing all the bits of the input data word having the first logic state into a first contiguous set of bit positions in the modified data word and all the bits of the input data word having the second logic state into a second contiguous set of the bit positions in the modified data word. The number of bit positions in the first and second sets is greater than or equal to zero. A result of the Boolean logic tree function is generated based on a pattern of the first and second logic states in the modified data word.

22 Claims, 5 Drawing Sheets

BOOLEAN LOGIC TREE REDUCTION CIRCUIT

FIELD OF THE INVENTION

The present invention relates to semiconductor integrated circuits and more specifically to a Boolean logic tree reduction circuit.

BACKGROUND OF THE INVENTION

Semiconductor integrated circuits often include large trees of combinational logic gates for reducing a large number of data bits into a smaller number of bits, such as a single bit, according to some logical function. Some logic trees apply a singular logical function to an entire data word such that the same function is applied to all bits in the incoming data word. This type of function can be referred to as a "word-wise" logical function. Examples of typical word-wise logical functions include AND, NAND, OR, NOR, XOR and XNOR functions.

As the sizes of transistors continue to become smaller with new fabrication technologies, the voltage supply levels that drive the transistors are also reduced to prevent damage to the small transistors. This limits the number of transistors that can be connected together in series to perform a logical function, such as an AND, and hence the maximum number of inputs to each logic gate. This number is based on the magnitude of the supply voltage and the voltage drop across each transistor. For example, a given semiconductor technology may limit the number of inputs to a logic AND gate to three bits.

This significantly increases the complexity of reduction circuits having a large number of input bits since small groups of bits must be combined in multiple logic levels. If the maximum number of inputs to a logic AND gate is three bits, then a word-wise AND of a 16-bit data word would require three logic levels. The first logic level could include six 3-input AND gates to logically AND six groups of three bits. The second logic level could include two 3-input AND gates to logically AND the outputs from the first level. Finally, the third logic level could include an additional AND gate to logically AND the outputs from the second level.

The complexity of the logic trees significantly increases with the number of input bits and with more complex logical functions such as XOR and XNOR. Large Boolean logic reduction trees therefore typically consume a large area on the integrated circuit and a relatively large amount of power and can have long critical path propagation delays.

Simplified logic reduction trees are therefore desired for performing arbitrary word-wise reduction functions in a tree structure.

SUMMARY OF THE INVENTION

One embodiment of the present invention is directed to a method of performing a Boolean logic tree function on all bits of a multiple-bit binary input data word having a plurality of bit positions. Each bit has one of first and second complementary logic states. A modified data word is formed by packing all the bits of the input data word having the first logic state into a first contiguous set of bit positions in the modified data word and all the bits of the input data word having the second logic state into a second contiguous set of the bit positions in the modified data word. The number of bit positions in the first and second sets is greater than or equal to zero. A result of the Boolean logic tree function is generated based on a pattern of the first and second logic states in the modified data word.

Another embodiment of the present invention is directed to a Boolean logic tree reduction circuit for performing a Boolean logic function on all bits of a multiple-bit binary input data word having a plurality of bit positions. Each bit has one of first and second complementary logic states. The circuit includes a packing circuit and a result generator. The packing circuit forms a modified data word by packing all the bits of the input data word having the first logic state into a first contiguous set of bit positions in the modified data word and all the bits of the input data word having the second logic state into a second contiguous set of the bit positions in the modified data word. The number of bit positions in the first and second sets is greater than or equal to zero. The result generator generates a result of the Boolean logic tree function based on a pattern of the first and second logic states in the modified data word.

DETAILED DESCRIPTION OF THE PREFERRED EMBODIMENTS

Figure 1:
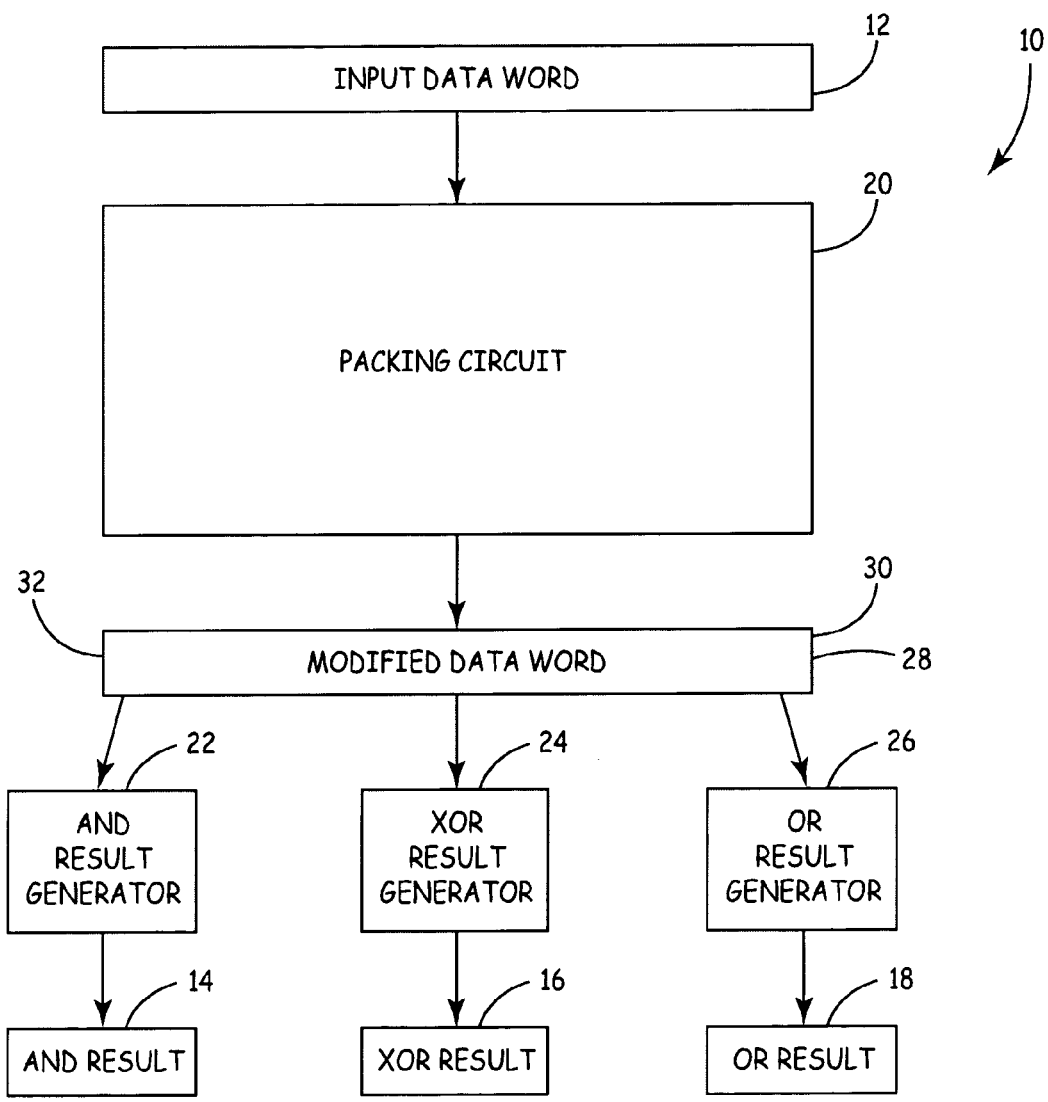
FIG. 1 is a block diagram illustrating a Boolean logic tree reduction circuit according to one embodiment of the present invention.

FIG. 1 is a block diagram illustrating a Boolean logic tree reduction circuit 10 according to one embodiment of the present invention. Circuit 10 receives multiple-bit data words on input 12 and performs one or more word-wise Boolean logic functions on all bits of the data word and produces a corresponding result for each function on result outputs 14, 16, and 18. In the embodiment shown in FIG. 1, circuit 10 performs word-wise logic AND, XOR and OR logical functions on the input data word. However, in alternative embodiments, circuit 10 can be modified to perform any number of these functions, their logical complements, and other logical functions.

Input data word 12 has a plurality of bit positions, wherein each bit position has one of first and second complementary binary logic states, such as a logic high state or a logic low state. For the word-wise logical AND function, circuit 10 produces a logic high state on result output 14 only if all bits in input data word 12 have logic high state. Otherwise it produces a logic low state. Similarly for the word-wise logical OR function, circuit 10 produces a logic low state on result output 18 only if all bits in input data word 12 have logic low state. Otherwise it produces a logic high state. For the word-wise XOR function, circuit 10 produces a logic high state on result output 16 if the number of bits in the input data word is odd.

Instead of using a traditional logic tree to reduce the input data bits to result outputs 14, 16 and 18, circuit 10 generates these results through a packing circuit 20, a logic AND result generator 22, a logic XOR result generator 24 and a logic OR result generator 26.

Packing circuit 20 receives input data word 12 and forms a modified data word 28 by packing all of the bits having the first logic state (e.g., a high state) into a first contiguous set of bit positions in modified data word 28 and all of the bits having the second logic state (e.g., a low state) into a second contiguous set of bit positions in modified data word 28. The number of bit positions in the first and second sets depends on the number of "high" and "low" bits in the input data word and can be greater than or equal to zero.

In one embodiment, all of the bits of input data word 12 having a logic high state are packed toward a first, right-hand end 30 of modified data word 28. All of the bits having a logic low state are packed toward a second, left-hand end 32 of modified data word 28.

Result generators 22, 24 and 26 can then generate result outputs 14, 16 and 18 based on the pattern of logic states in modified data word 28. For the logic AND function, if all of the bits in input data word 12 are high, then the left-most bit position in modified data word 28, at left-hand end 32 will be high. If any one of the bits in input data word 12 is low, then the left-most bit position will be low after the packing operation. Therefore, logic AND result generator 22 can generate the logic AND result output 14 based solely on whether the bit position at left-hand end 32 has a logic high state or a logic low state.

Similarly for the logic OR function, if all of the bits in input data word 12 are low, then the right-most bit position at right-hand end 30 will be low. If any one of the bits in input data word 12 is high, then the right-most bit position will be high after the packing operation. Therefore, logic OR result generator 26 can generate the logic OR result output 18 based solely on whether the bit position at right-hand end 30 has a logic high state or a logic low state.

XOR result generator 24 can generate the XOR result 16 based on whether the number of contiguous bit positions having the logic high state in modified data word 28 is even or odd. Since all bits having a logic high state are packed toward one end, such as end 30, XOR result generator 24 can generate the XOR result 16 based on whether the left-most logic high state (that is closest to left end 32) resides in an even bit position or an odd bit position. The bit positions can be counted from right end 30 toward left end 30, beginning with an odd number at right end 30.

If the left-most bit position having a logic high state is an even bit position, then XOR result 16 would be low (false). If the left-most bit position having a logic high state is an odd bit position, then XOR result 16 would be high (true). Similar operations can be performed to generate NAND, NOR and XNOR results, with appropriate inversions.

Figure 2:
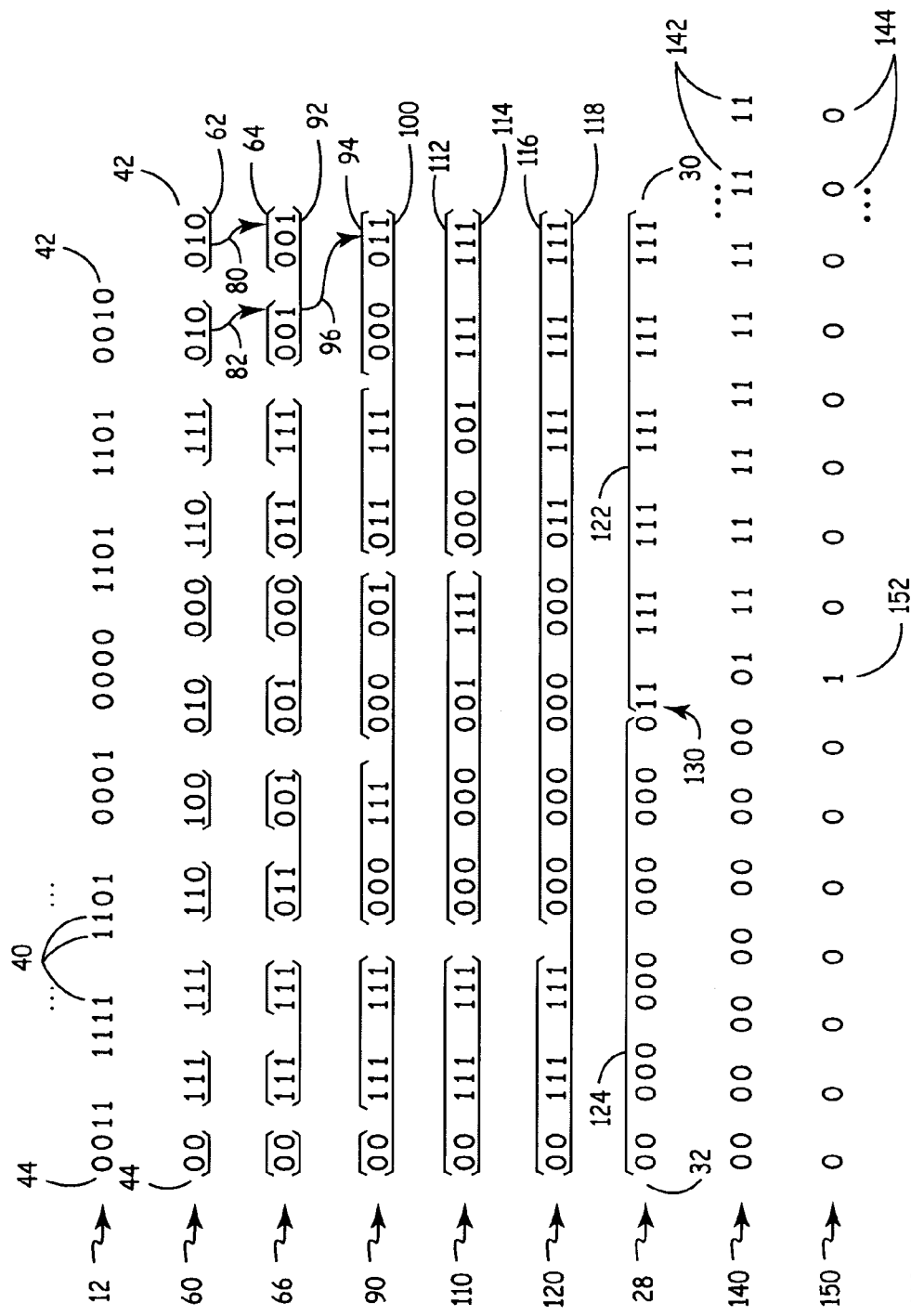
FIG. 2 illustrates an example of a packing operation for an arbitrary 32-bit input data word.

FIG. 2 illustrates an example of a packing operation for an arbitrary 32-bit input data word 12. Each row in FIG. 2 represents a successive step in packing the bits toward one end or the other and generating the function results according to one embodiment of the present invention. A "1" in FIG. 2 represents a logic high state, and a "0" in FIG. 2 represents a logic low state. Other symbol conventions can also be used.

Input data word 12 has a plurality of bit positions 40 between a right end 42 and a left end 44. As discussed above, packing circuit 20 (shown in FIG. 1) generates modified data word 28 by packing all of the bits of data word 12 having the logic high state (a "1") toward right end 30 of modified data word 28 and packing all the bits of data word 12 having the logic low state (a "0") toward left end 30.

As shown in row 60, packing circuit 20 groups adjacent bits in data word 12 to form a first level of multiple-bit groups 62, beginning at right end 42 and proceeding toward left end 44. In this example, each of the groups 62, shown in brackets, has three bits. The number of bits in each group can be set based on the maximum number of transistors that can be connected in series with one another in the technology in which the integrated circuit will be fabricated. However, each group 62 can include a lesser number of bits in alternative embodiments of the present invention.

For each group 62 in row 60, packing circuit 20 packs all of the 1's toward the right end, for example, of that group. The right end of each group 62 corresponds in orientation to the right end 42 of input data word 12. This forms a modified first level group 64, shown in row 66, for each of the first level groups 62. For example, the right-most group 62 in row 60 has a logic pattern "010". Arrow 80 illustrates the shifting or packing of a high state in the middle bit position of group 62 to the first bit position in modified group 64, toward the right end of the group. Similarly, arrow 82 represents the shifting or packing of a logic high state in another group 62 toward the right end of that group.

Row 90 represents the output of a second logic level in packing circuit 20. Packing circuit 20 groups adjacent pairs of the modified first level groups 64 into larger second-level groups 92. Each second-level group 92 has six bits, except for the last group on the left. Again, for each second-level group 92, packing circuit 20 packs any of the bits in that group having a logic high state toward the right end of that group and all bits having the logic low state toward the left end of that group to form a modified second-level group 94 group in row 90. For example, arrow 96 represents the shifting or packing of a logic high state in a group 92 toward the right end of modified group 94.

Packing circuit 20 groups adjacent pairs of the modified second-level groups 64 into larger 12-bit, third-level groups 100. Row 110 represents the output from the third level of logic in packing circuit 20. Again, all the bits in each second-level group 100 having a logic high state are packed toward the right side of the group to form a modified third-level group 112.

Adjacent pairs of modified third-level groups 112 are grouped to form respective 24-bit, fourth-level groups 114. Row 120 represents the output of the forth level of logic in packing circuit 20. In the fourth level of logic, packing circuit 20 packs all of the bits in each fourth-level group 114 to the right side of the group to generate a respective modified fourth-level group 116. Packing circuit 120 groups adjacent pairs of modified fourth-level groups 116 into a respective fifth-level group 118. Finally, packing circuit 20 uses a fifth level of logic to pack all of the bits having the logic high state in the fifth level group 118 toward the right end of the group to form modified data word 28.

After the packing operation is complete, modified data word 28 includes a first set 122 of contiguous bit positions having the logic high state and a second set 124 of bit positions having the logic low state. With all of the logic high states packed to the right, and all of the logic low states packed to the left, result generators 22 and 26 (shown in FIG. 1) can generate logical AND result output 14 and the logical OR result output 18 solely from the logic states at the left and right ends of modified data word 28.

In this example, the left-most bit position at left end 32 is a "0", indicating that a word-wise logical AND of input data word 12 has a "0" or "false" result. Since the right-most bit position adjacent right end 30 is a "1", this indicates that a word-wise logical OR of input data word 12 has a "1" or "true" result.

With respect to the logical XOR function, the XOR result 16 (shown in FIG. 1) depends on whether input data word 12 has an odd number of logic "1s". Since all "1s" are packed to the right side of modified data word 28, the bit position of the left-most "1" (arrow 130) in word 28, which is closest to second end 32, indicates whether the XOR result is true or false. XOR result generator 24 can therefore generate the XOR result 16 based on whether the bit position of bit 130 resides in an even bit position or an odd bit position when counting from right end 30 toward left end 32 and beginning with an odd number at right end 30.

In one embodiment, XOR result generator 24 determines whether the bit position of the left-most "1" is even or odd by performing a 2-bit exclusive-OR on adjacent pairs of bits in modified data word 28. Row 140 shows modified data word 28 grouped into 2-bit pairs 142. Each pair of bits 142 is applied to a 2-input XOR gate (not shown) to generate a respective comparison output 144. Row 150 represents the outputs of each XOR gate.

Since the left-most logic "1" resides in an odd bit position 130 (in this case the 17th position from right end 30), the output of the corresponding XOR gate is a logic "1", as shown by arrow 152. Therefore, there is an odd number of logic "1s" in data word 12. Outputs 150 can be connected together to perform a wired-OR function to generate XOR result output 16 (shown in FIG. 1), which is shown in row 160.

Any circuit configuration can be used to pack bits of the input data word toward one end or the other, and the number of bits in each group and the number of logic levels can vary in alternative embodiments.

In one embodiment, each logic level in packing circuit 20 is implemented with a set of multiplexers for selectively shifting bits within each group. For example, Table 1 is a truth table indicating the action taken for each of the possible bit patterns of the first-level groups 62, where DIN[2:0] represents the three input data bits of that group.

TABLE 1

| DIN[2:0] | ACTION | RESULT |
|---|---|---|
| 000 | Right shift by 2 | 000 |
| 001 | No shift | 001 |
| 010 | Right shift by 1 | 001 |
| 011 | No shift | 011 |
| 100 | Right shift by 2 | 001 |
| 110 | Right shift by 1 | 011 |
| 111 | No shift | 111 |

Table 1 can be implemented with a set of three-to-one multiplexers. If the lower two bit positions DIN[1:0] in a group is a binary "10", then the 3-bit group is shifted to the right by one bit with the left-most bit position DIN[2:1] of the group being filled with a zero. If the lower two bit positions DIN[1:0] of the group is a binary "00", the 3-bit group is shifted to the right by two bits, with the two left-most bit positions DIN[2:1] being filled with zeros. Otherwise, the 3-bit group is not shifted.

Figure 3:
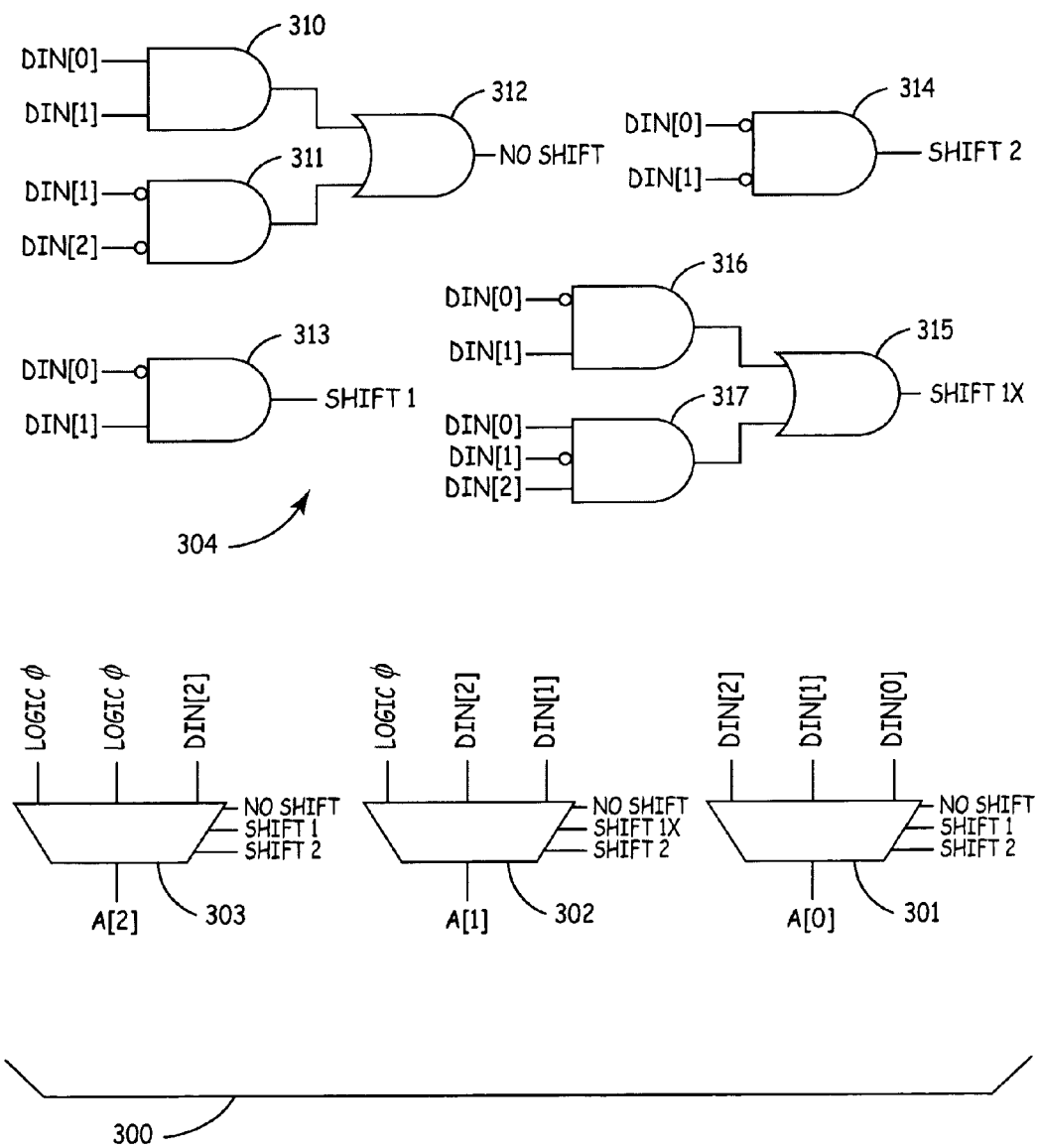
FIG. 3 is a schematic diagram illustrating a multiplexer circuit within a first level of logic in a packing circuit shown in FIG. 1, according to one embodiment of the present invention.

FIG. 3 is a schematic diagram illustrating a multiplexer circuit 300 within the first level of logic in packing circuit 20 (shown in FIG. 1) according to one embodiment of the present invention. The diagram shown in FIG. 3 is repeated for each group 62 shown in FIG. 2. The first level of logic includes a set of 3-to-1 multiplexers 301–303 and associated control logic 304 for implementing Table 1. The bits of each group 62 are labeled DIN[2:0], and the resulting bits of modified group 64 are labeled A[2:0].

Data inputs DIN[2:0], along with "logic 0" states, are coupled to selected data inputs of multiplexers 301–303 to enable the multiplexers to selectively shift these bits to outputs A[2:0] as a function of shift control signals NO SHIFT, SHIFT 1, SHIFT 1X and SHIFT 2.

When NOSHIFT is active, multiplexers 301–303 pass DIN[2:0] to A[2:0] so that the bits are not shifted. When SHIFT1 and SHIFT1X are active, multiplexers 301–303 pass a "logic 0", DIN[2] and DIN[1] to A[2:0] so that the group is shifted to the right by one bit position and a leading "0" is inserted at the left-most bit position. When SHIFT2 is active, multiplexer 301 passes DIN[2] to A[0], and multiplexers 302 and 303 insert leading zeros into A[2:1] so that the group is shifted to the right by two bit positions.

Control logic 304 generates control signals NOSHIFT, SHIFT1, SHIFT1X and SHIFT2 based on the logic states of DIN[2:0]. NOSHIFT is generated by logic AND gates 310 and 311 and logic OR gate 312. SHIFT1 is generated by logic AND gate 313 based on DIN[1:0]. SHIFT1X is generated by logic AND gates 316 and 317 and logic OR gate 315 based on DIN[2:0]. SHIFT2 is generated by logic AND gate 314 based on DIN[1:0]. Any other arrangement of control logic can be used for controlling multiplexers 300–302 to implement Table 1 or any modified version of Table 1 in alternative bodies of the present invention. In addition, other methods of shifting or otherwise packing logic states within each group can also be used in alternative embodiments of the present invention.

Figure 4:
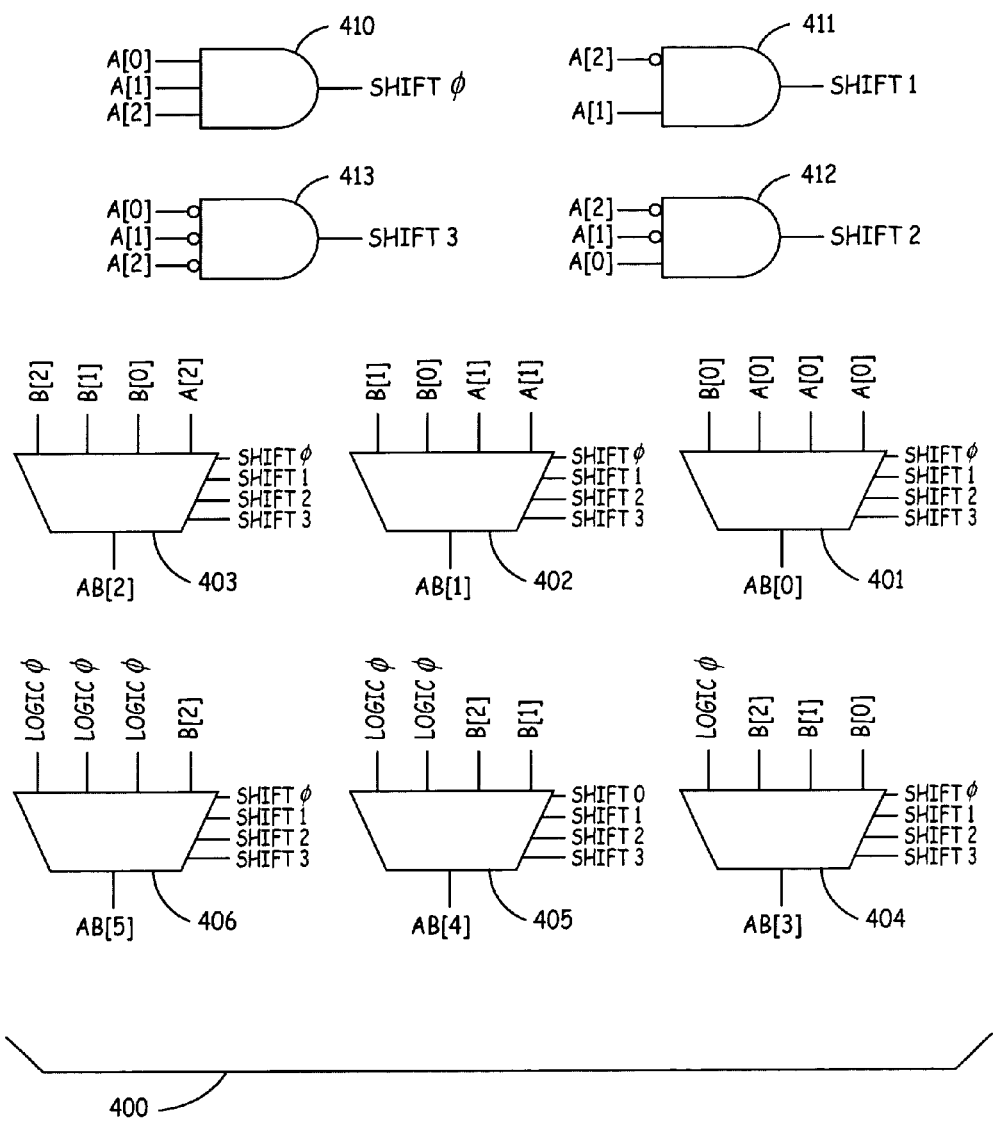
FIG. 4 is a schematic diagram illustrating a multiplexer circuit within a second level of logic in THE packing circuit, according to one embodiment of the present invention.

FIG. 4 is a schematic diagram illustrating a multiplexer circuit 400 within the second level of logic in packing circuit 20 (shown in FIG. 1) according to one embodiment of the present invention. Multiplexer circuit 400 is repeated once for each of the second-level groups 92 shown in FIG. 2. Since there are six bits in each group 92, multiplexer circuit 400 has six multiplexers 401–406 for generating the six bits of each modified second-level groups 94 (also shown in FIG. 2).

The first three bits (the "right" subgroup of bits) in each second-level group 92 are labeled A[2:0] in FIG. 4, and the second three bits (the "left" subgroup of bits) in each second-level group 92 are labeled B[2:0] in FIG. 4. The six bits of the modified second-level group 94 are labeled AB[5:0].

Each of the multiplexers 401–406 has four shift control or "select" inputs coupled to SHIFT0, SHIFT1, SHIFT2 and SHIFT3, respectively, which determine how many bit positions bits B[2:0] will be shifted into A[2:0] to produce AB[5:0], with leading "logic 0's" being inserted into the higher-order bit positions. Essentially, multiplexers 401–406 shift bits from the left subgroup B[0:2] into the right subgroup A[0:2] by the number of logic "0s" in the right subgroup. The outputs of multiplexers 401–406 generate the respective bits of AB[0:5].

The control signals SHIFT0-SHIFT3 are generated by AND gates 410, 411, 412 and 413, respectively, based on the logic states of A[2:0]. Again, any suitable circuit can be used for packing the bits in the second level.

Figure 5:
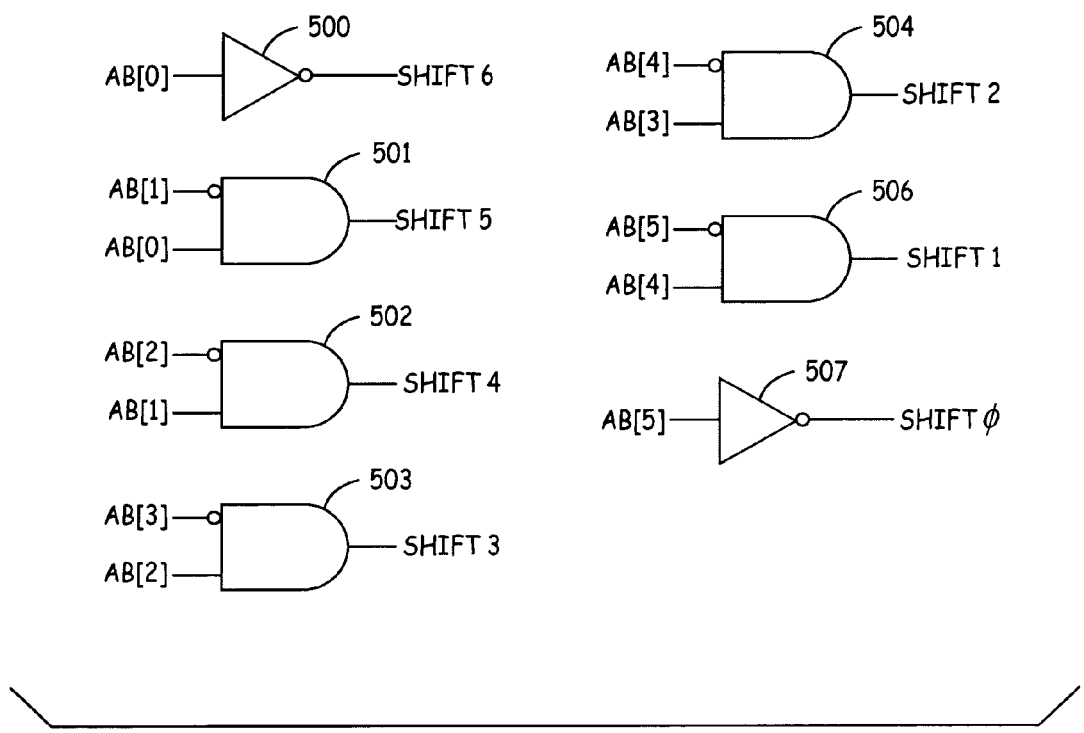
FIG. 5 is a schematic diagram illustrating multiplexer control logic within a third level of logic in the packing circuit, according to one embodiment of the present invention.

FIG. 5 shows the shift control for one of the third-level groups 100 (FIG. 2). Inverter 500, AND gates 501–505 and buffer 506 generate shift control signals SHIFT6-SHIFT0, respectively, based the patterns of AB[0:5]. Each third-level group 100 has twelve bits, and the right subgroup of these bits is labeled AB[5:0]. The number of "0s" in AB[0:5] determines the number of bit positions that the left subgroup will be shifted into the right subgroup within each third-level group 100. Control signals SHIFT0-SHIFT6 represent the number of bit positions to be shifted. This process can be repeated for each subsequent level in packing circuit 20 until all "1s" are aligned to the right (or left) in modified data word 28. This circuit can be implemented for any arbitrary N-bit input data word by $\log_2 N/3$ layers of multiplexers, where N is any positive integer value.

The method and apparatus for performing a word-wise Boolean logic function described above require a smaller number of transistors to implement than the traditional method of using large logical function trees, particularly for more complex logical functions such as an XOR or XNOR. The reduction in gate count provides a significant reduction in the area and power consumed by the circuit. Also, the propagation delay along the longest, critical path through the circuit is reduced significantly as compared to traditional circuits. Finally, spurious transitions can be reduced or eliminated.

Although the present invention has been described with reference to preferred embodiments, workers skilled in the art will recognize that changes may be made in form and detail without departing from the spirit and scope of the invention. For example, any suitable method or circuit for packing or otherwise shifting logic states toward one end or another can be used in alternative embodiments of the present invention. The high states, the low states or both can be shifted. Also, any method or circuit can be used to generate the logical function results based on the patterns of one or more bits in the modified data word. The terms AND, OR and XOR as used in the specification and claims include their logical complements NAND, NOR and XNOR and other variants since the basic AND, OR and XOR functions are performed in either case.

What is claimed is:

1. A method of performing a Boolean logic tree function on all bits of a multiple-bit binary input data word having a plurality of bit positions, wherein each bit has one of first and second complementary logic states, the method comprising:

(a) forming a modified data word by packing all the bits of the input data word having the first logic state into a first contiguous set of bit positions in the modified data word and all the bits of the input data word having the second logic state into a second contiguous set of the bit positions in the modified data word, wherein the number of bit positions in the first and second sets is greater than or equal to zero; and (b) generating a result of the Boolean logic tree function based on a pattern of the first and second logic states in the modified data word.

2. The method of claim 1 wherein:

step (a) comprises packing all the bits of the input data word having the first logic state toward a first end of the modified data word, and packing all the bits of the input data word having the second logic state toward a second, opposite end of the modified data word; and step (b) comprises generating the result based solely on whether the bit position at one of the first and second ends of the modified data word has the first or second logic state.

3. The method of claim 2 wherein:

the Boolean logic tree function comprises a logical AND of all the bits in the input data word;

the first and second logic states comprise logic high and low states, respectively;

step (a) comprises packing all the bits of the input data word having the logic high state into the first set of bit positions, toward the first end of the modified data word, and packing all the bits of the input data word having the logic low state into the second set of bit positions, toward the second end of the modified data word; and step (b) comprises generating the result based solely on whether the bit position at the second end of the modified data word has the logic high state or the logic low state.

4. The method of claim 2 wherein:

the Boolean logic tree function comprises a logical OR of all the bits in the input data word;

the first and second logic states comprise logic high and low states, respectively;

step (a) comprises packing all the bits of the input data word having the logic high state into the first set of bit positions, toward the first end of the modified data word, and packing all the bits of the input data word having the logic low state into the second set of bit positions, toward the second end of the modified data word; and step (b) comprises generating the result based solely on whether the bit position at the first end of the modified data word has the logic high state or the logic low state.

5. The method of claim 2 wherein:

the Boolean logic tree function comprises a logical OR and a logical AND of all the bits in the input data word;

the first and second logic states comprise logic high and low states, respectively;

step (a) comprises packing all the bits of the input data word having the logic high state into the first set of bit positions, toward the first end of the modified data word, and packing all the bits of the input data word having the logic low state into the second set of bit positions, toward the second end of the modified data word; and step (b) comprises generating a result of the logical AND function based on whether the bit position at the second end of the modified data word has the logic high state or the logic low state and generating a result of the logical OR function based on whether the bit position at the first end of the modified data word has the logic high state or the logic low state.

6. The method of claim 1 wherein:

the Boolean logic tree function comprises a logical XOR of all the bits in the input data word; and step (a) comprises packing all the bits of the input data word having the first logic state toward a first end of the modified data word, and packing all the bits of the input data word having the second logic state toward a second, opposite end of the modified data word; and step (b) comprises generating the result based on the bit position of the bit in the modified data word that has the first logic state and is closest to the second end.

7. The method of claim 6 wherein step (b) further comprises:

(b) (1) generating the result based on whether the bit position of the bit that has the first logic state and is closest to the second end is an even bit position or an odd bit position when counting from the first end toward the second end and beginning with an odd number at the first end.

8. The method of claim 6 wherein step (b) further comprises:

(b) (1) beginning at the first end and proceeding toward the second end, grouping adjacent bits in the modified data word into pairs; and (b) (2) generating the result based on whether the exclusive-OR of any one of the pairs is true.

9. The method of claim 8 wherein step (b)(2) comprises applying each pair bits to a respective two-input exclusive-OR gate and performing a wire-OR function on the outputs from all the exclusive-OR gates.

10. The method of claim 1 wherein the modified data word comprises first and second opposite ends and step (a) comprises:
(a)(1) grouping adjacent ones of the bits of the input data word into a present level of multiple-bit groups, beginning at the first end and proceeding toward the second end;
(a)(2) for each group in the present level, packing any of the bits in that group having the first logic state toward a first end of that group, which corresponds in orientation to the first end of the input data word, to form a respective modified present level group;
(a)(3) grouping adjacent pairs of the modified present level groups into respective higher level groups, with the higher level groups becoming the present level groups;
(a)(4) repeating step (a)(2) for present level groups generated in step (a)(3); and
(a)(5) repeating steps (a)(2) through (a)(4) until there is only one present level group, which has the same number of bit positions as the input data word and any of the bits in that group having the first logic state have been packed toward a first end of that group.

11. The method of claim 10 wherein step (a)(2) comprises shifting the bits in that group having the first logic state to different bit positions in that group through a multiplexer.

12. A Boolean logic tree reduction circuit for performing a Boolean logic function on all bits of a multiple-bit binary input data word having a plurality of bit positions, wherein each bit has one of first and second complementary logic states, the circuit comprising:
(a) packing means for forming a modified data word by packing all the bits of the input data word having the first logic state into a first contiguous set of bit positions in the modified data word and all the bits of the input data word having the second logic state into a second contiguous set of the bit positions in the modified data word, wherein the number of bit positions in the first and second sets is greater than or equal to zero; and
(b) means for generating a result of the Boolean logic tree function based on a pattern of the first and second logic states in the modified data word.

13. The Boolean logic tree reduction circuit of claim 12 wherein:
the packing means comprises means for packing all the bits of the input data word having the first logic state toward a first end of the modified data word, and packing all the bits of the input data word having the second logic state toward a second, opposite end of the modified data word; and
the means for generating comprises means for generating the result based solely on whether the bit position at one of the first and second ends of the modified data word has the first or second logic state.

14. The Boolean logic tree reduction circuit of claim 13 wherein:
the Boolean logic tree function comprises a logical AND of all the bits in the input data word;
the first and second logic states comprise logic high and low states, respectively;
the packing means further comprises means for packing all the bits of the input data word having the logic high state into the first set of bit positions, toward the first end of the modified data word, and packing all the bits of the input data word having the logic low state into the second set of bit positions, toward the second end of the modified data word; and
the means for generating further comprises means for generating the result based solely on whether the bit position at the second end of the modified data word has the logic high state or the logic low state.

15. The Boolean logic tree reduction circuit of claim 13 wherein:
the Boolean logic tree function comprises a logical OR of all the bits in the input data word;
the first and second logic states comprise logic high and low states, respectively;
the packing means further comprises means for packing all the bits of the input data word having the logic high state into the first set of bit positions, toward the first end of the modified data word, and packing all the bits of the input data word having the logic low state into the second set of bit positions, toward the second end of the modified data word; and
the means for generating further comprises means for generating the result based solely on whether the bit position at the first end of the modified data word has the logic high state or the logic low state.

16. The Boolean logic tree reduction circuit of claim 13 wherein:
the Boolean logic tree function comprises a logical OR and a logical AND of all the bits in the input data word;
the first and second logic states comprise logic high and low states, respectively;
the packing means further comprises means for packing all the bits of the input data word having the logic high state into the first set of bit positions, toward the first end of the modified data word, and packing all the bits of the input data word having the logic low state into the second set of bit positions, toward the second end of the modified data word; and
the means for generating further comprises means for generating a result of the logical AND function based on whether the bit position at the second end of the modified data word has the logic high state or the logic low state and generating a result of the logical OR function based on whether the bit position at the first end of the modified data word has the logic high state or the logic low state.

17. The Boolean logic tree reduction circuit of claim 12 wherein:
the Boolean logic tree function comprises a logical XOR of all the bits in the input data word; and
the packing means comprises means for packing all the bits of the input data word having the first logic state toward a first end of the modified data word, and packing all the bits of the input data word having the second logic state toward a second, opposite end of the modified data word; and
the means for generating comprises means for generating the result based on the bit position of the bit in the modified data word that has the first logic state and is closest to the second end.

18. The Boolean logic tree reduction circuit of claim 17 wherein the means for generating further comprises means for generating the result based on whether the bit position of the bit that has the first logic state and is closest to the second end is an even bit position or an odd bit position when counting from the first end toward the second end and beginning with an odd number at the first end.

19. The Boolean logic tree reduction circuit of claim 17 wherein the means for generating further comprises means for:

(a) beginning at the first end and proceeding toward the second end, grouping adjacent bits in the modified data word into pairs; and (b) generating the result based on whether the exclusive-OR of any one of the pairs is true.

20. The Boolean logic tree reduction circuit of claim 19 wherein the means for generating in (b) further comprises means for applying each pair bits to a respective two-input exclusive-OR gate and performing a wire-OR function on the outputs from all the exclusive-OR gates.

21. The Boolean logic tree reduction circuit of claim 12 wherein the modified data word comprises first and second opposite ends and the packing means comprises means for:

(a) grouping adjacent ones of the bits of the input data word into a present level of multiple-bit groups, beginning at the first end and proceeding toward the second end;

(b) for each group in the present level, packing any of the bits in that group having the first logic state toward a first end of that group, which corresponds in orientation to the first end of the input data word, to form a respective modified present level group;

(c) grouping adjacent pairs of the modified present level groups into respective higher level groups, with the higher level groups becoming the present level groups;

(d) repeating step (b) for present level groups generated in step (c); and (e) repeating steps (b) through (d) until there is only one present level group, which has the same number of bit positions as the input data word and any of the bits in that group having the first logic state have been packed toward a first end of that group.

22. The Boolean logic tree reduction circuit of claim 21 wherein the means for packing in step (b) a multiplexer.

* * * * *